United States Patent [19]

Matsuta

[11] Patent Number: 4,710,737
[45] Date of Patent: Dec. 1, 1987

[54] BAND SWITCHING CIRCUIT TUNER
[75] Inventor: Shigetoshi Matsuta, Soma, Japan
[73] Assignee: Alps Electric, Ltd., Japan
[21] Appl. No.: 702,045
[22] Filed: Feb. 15, 1985
[30] Foreign Application Priority Data Feb. 15, 1984 [JP] Japan ................. 59-19985[U]

[51] Int. Cl.$^4$ ............................................ H03J 5/24
[52] U.S. Cl. ..................................... 334/56; 334/60;
455/188
[58] Field of Search ............... 334/1, 47, 56, 55, 60;
455/188, 190, 191, 195, 180

[56] References Cited

U.S. PATENT DOCUMENTS

| | | |
|---|---|---|
| 3,646,450 | 2/1972 | Ma ............................ 455/188 X |
| 4,189,678 | 2/1980 | Sakamoto et al. ................. 455/180 |
| 4,291,290 | 9/1981 | Ijichi et al. ..................... 334/1 |
| 4,607,391 | 8/1986 | Matsuda ..................... 334/47 X |

FOREIGN PATENT DOCUMENTS

| | | |
|---|---|---|
| 2522835 | 11/1976 | Fed. Rep. of Germany ........ 334/47 |
| 2809489 | 9/1979 | Fed. Rep. of Germany ...... 455/188 |
| 48-520 | 3/1983 | Japan . |

*Primary Examiner*—Eugene R. LaRoche
*Assistant Examiner*—Benny Lee
*Attorney, Agent, or Firm*—Guy W. Shoup

[57] ABSTRACT

A band switching circuit of a tuner comprises a tuning circuit, a switching diode connected to the tuning circuit, a pair of band switching terminals coupled across the switching diode. A novel transistor is inserted between one of the band switching terminals and one end of the switching diode with one PN junction of the novel transistor opposing in polarity to the PN junction of the switching diode.

2 Claims, 4 Drawing Figures

BAND SWITCHING CIRCUIT TUNER

FIELD OF THE INVENTION

The present invention relates to a tuner which is incorporated in the television receiving set, VTR (video tape recorder) and the like and can eliminate interference if both television set and VTR are put in use at the same time.

BACKGROUND OF THE INVENTION

Recently, with the popularity of the VTR use of the television receiving set (hereinafter referred to as the TV) and the VTR jointly to do TV watching, and recording and reproducing by means of VTR is increasing.

On connecting the TV with the VTR, an antenna, TV and VTR are connected to one another, and signal switching thereamong is carried out by a signal switching device equipped within the VTR. The signal switching device, is generally employed in order to allow the use of either the TV or the VTR, for instance, the use of the TV only, i.e., the VTR not powered. General connection between the TV and the VTR in such a case as above is illustrated in FIG. 1.

In FIG. 1, 1 is an antenna, 2 is VTR, 3 is TV, 4 is a signal switching device equipped within VTR 2, 5 is a distributor, 6, 8, 10 are high-pass filters, 7, 9, 11 are switching diodes for switching between the signal from the antenna 1 and the signal from VTR 2 to be transmitted to TV 3, respectively; 12, 15 are tuners equipped within VTR 2 and TV 3 respectively, and 14 is a modulator within VTR 2. In the structure shown in FIG. 1, VTR 2 and TV 3 are put in use properly through manipulation of a control section (not shown) causing switching of the switching diodes 7, 9, 11.

For example, at the time of normal reception of television broadcasting, the switching diodes 7, 9, 11 are turned off, the signal from the antenna 1 is transmitted through the distributor 5 and the high-pass filters 6, 8, 10 and applied to the tuner 15 of TV 3. Or, at the time of reproducing a recorded picture, the switching diodes 7, 9 are turned on to attenuate the signal from the antenna 1 passed through the distributor 5 and, on the other hand, the switching diode 11 is also turned on to apply a video signal from a recording-reproducing circuit 13 through the modulator 14 to the tuner 15 of TV 3.

The important portion of an input circuit in the conventional tuners 12, 15 employed in FIG. 1 has such a structure as shown in FIG. 2.

In FIG. 2, 21 is an input terminal of the tuner, 22 is a branching filter for separating the television signal which is received at the input terminal 21 and includes mingled VHF and UHF waves, composed of a low-pass filter 23 and a high-pass filter 24. 25 is an input tuning circuit which composes a part of the VHF tuner and is composed of tuning coils 26, 27, a varactor diode 28, a switching diode 29 for switching the reception bands, and by-pass capacitors 30, 31, 32. 39 is an RF amplifier included in the VHF tuner section whose output 40 is connected to an input section of a double tuning circuit within the VHF tuner. 41 is a terminal for a tuning voltage to be impressed on the varactor diode 28 of the tuning circuit 25, this terminal 41 being connected also to varactor diodes employed in other tuning circuits, local oscillator circuits and the like (not shown) within the VHF tuner and UHF tuner 44. 42, 43, 45 are terminals for band-switching sources to switch the reception television channel over to low VHF channels, high VHF channels, or UHF channels, respectively. The VHF band switching operation is carried out by cooperation of the voltages to be impressed on the terminals 42, 43, the switching diode 29, and resistors 34, 35, 37. The resistor 36 and the diode 47 are not only relating to the band switching operation, but also serving as discharging means for a charged voltage of the by-pass capacitors 30. That is, on the band switching operation described hereinafter, at the time of switching from high VHF channel reception to low VHF channel reception, the switching diode 29 is changed from the forward biased state to the reverse biased state. When the switching diode 29 changes from the conducting state to the non-conducting state, the charged voltage on the by-pass capacitor 30 is required to be discharged quickly, therefor, grounding is effected through the resistor 36 and the diode 47 to cause discharging.

The reception band switching operation is performed in the manner below. Firstly, on receiving the low VHF channels, a voltage of, for example, 12 volts is impressed on the terminal 43 with the terminal 42 not impressed, whereby the reverse bias is applied across the switching diode 29 thereby to turn off, so that the coils 26 and 27 are connected in series and, as a result, the tuning circuit 25 has a circuit characteristic needed for reception of the VHF low channels. At the time of receiving the high VHF channels, a voltage of, for example, 12 volts is impressed on the terminal 42 with the terminal 43 not impressed, whereby the switching diode conducts in the forward direction to turn on, so that the coil 27 is short-circuited thereacross by the switching diode 29 and, as a result, the tuning circuit 25 has a circuit characteristic needed for reception of the high VHF channels. Further, on receiving the UHF, no voltage is impressed on the terminals 42, 43 and no power is supplied to the RF amplifier 39, but, only a UHF tuner section 44 is powered to amplify the IF signal of the UHF.

In case the conventional tuner of the foregoing type is equipped in VTR 2 and TV 3 respectively and connected as shown in FIG. 1, there was the drawback that if TV 3 is operated with VTR 2 off, for instance, a jamming signal is generated from VTR 2 in spite of its non-powered state and TV 3 is influenced thereby. Namely, in the non-powered state of the VTR a voltage is not impressed on the tuner 12 within VTR 2. Thus, the switching diode 29 forms a closed circuit through the resistors 34, 35, 37, 38 and an impedance 48 of a power source 50 for the high VHF channels, and no voltage exists across the anode and cathode of the diode 29, i.e., it is zero-biased. The television signal from the antenna 1 is applied through the distributor 5 to the tuner 12 of non-powered VTR 2 and to the tuner 15 of TV 3 being in operation. When the level of the received television signal is extremely high, the television signal flows through the switching diode 29 in the tuner 12 within VTR 2 which is zero-biased as the result of being non-powered. Owing to the rectification action of the switching diode 29 a loop is created so that a rectified current flows through resistor 34, resistor 35, internal impedance 48 of the power source 50, resistor 38 and resistor 37 in this direction, accordingly, the received television signal of a strong level can flow as above. Element 49 represents a current source of power source 50. Because the diode is generally a non-linear element, the diode 29 generates higher harmonics of the television signal when the television signal flows into the diode 29. The generated higher harmonics are applied from the tuner 12 through the distributor 5, high-pass filters 6, 8, 10 within the signal switching device 4 and input into the tuner 15 of TV 3. In such a state, if TV 3 is receiving the UHF television channel, these higher harmonics act as the jamming signal because the frequency band of the higher harmonics extend up to the UHF band. Thus there was the drawback that the normal reception of the UHF television channel is impeded by interference.

SUMMARY OF THE INVENTION

It is an object of the present invention to provide a tuner of a simple structure which obviates the interference as described hereinabove even if TV and VTR are used together.

The band switching circuit of the tuner according to the present invention is characterized in that a transistor is added in a DC circuit including resistors connected across the anode and cathode of a switching diode for band switching provided in a tuning circuit, and the transistor is connected so that its one PN junction is in the opposite direction against the PN junction of the switching diode whereby the DC circuit does not form a closed loop.

DETAILED DESCRIPTION OF THE INVENTION

Figure 2:
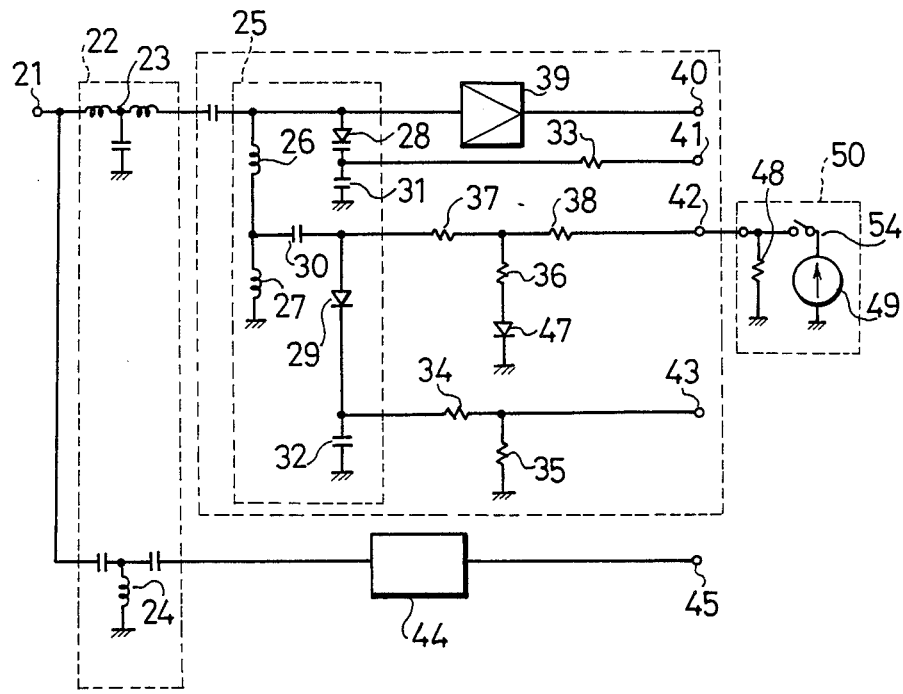
FIG. 2 is a circuit diagram showing the important portion of an input section of the conventional tuner.
Figure 3:
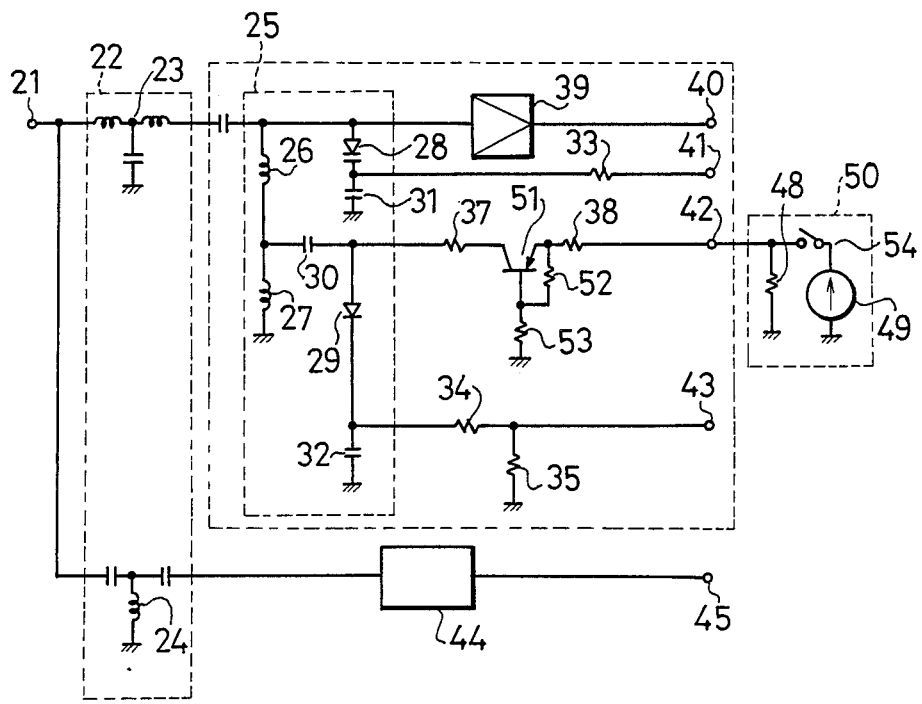
FIG. 3 is a circuit diagram showing the important portion of an input section of a tuner according to the present invention.

The present invention will be described with reference to FIG. 3 showing the embodiment according to the present invention. Elements shown in FIG. 3 and equivalent to those shown in FIG. 2 bear the same reference numbers with their description omitted.

Figure 1:
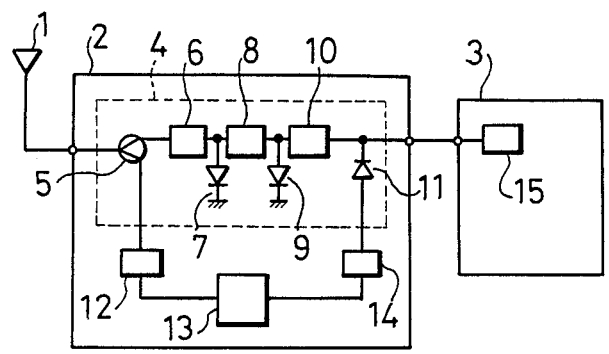
FIG. 1 is a block diagram showing the connection relationship between VTR and TV.

In FIG. 3, 51 is a PNP type transistor in the present invention, resistors 52,53 are bias resistors to actuate the transistor 51 at the time of reception of the high VHF channels. 42, 43 are voltage supply terminals for band switching whose function is the same as that of FIG. 1. That is, at the time of reception of the low VHF channels, a switch 54 is opened and 12 volts is impressed on the terminal 43 to turn off the switching diode 29, whereby the coils 26, 27 are allowed to work in series, so that the tuning circuit 25 has the circuit characteristic necessary for reception of the low VHF channels. On the contrary, at the time of reception of the high VHF channels, the terminal 43 is left open and the switch 54 is short-circuited to impress 12 volts on the terminal 42, whereby the transistor 51 is changed into the conducting state, the switching diode 29 is conducted in the forward direction to short-circuit across the coil 27, so that the tuning circuit 25 has the circuit characteristic necessary for reception of the high VHF channels. Further, at the time of reception of the UHF channels, the terminal 43 and the switch 54 are left open, the RF amplifier 39 is not powered to stop the receiving function of the VHF tuner section, and, contrarily, power is supplied to the UHF tuner section 44.

Figure 4:
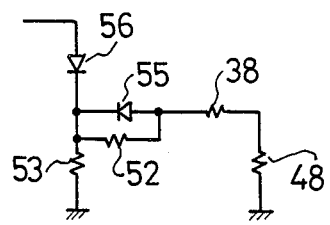
FIG. 4 is an equivalent circuit diagram showing a portion of the embodiment according to the present invention.

FIG. 4 illustrates the equivalent circuit of transistor 51, resistors 38, 52, 53 and internal impedance 48 when the switch 54 is left open. A diode 56 represents a PN junction across the collector and base of the transistor 51 and a diode 55 represents a PN junction across the emitter and base of the transistor 51.

In the embodiment, the diode 56 representing the PN junction across the collector and base of the transistor 51 is in the opposite direction with respect to the polarity of the switching diode 29 in the closed loop formed by switching diode 29, resistors 34, 35, 38, 52 and internal impedance 48 and in the other closed loop formed by switching diode 29, resistors 34, 35 and 53. Accordingly, when both the terminal 43 and the switch 54 are left open, because the switching diode 29 and the diode 56 differ in polarity in the closed loop formed by switching diode 29, diode 56, resistors 34, 35 and 53 and in the other closed loop formed by switching diode 29, diode 56, resistors 34, 35, 38 and internal impedance 48, the television signal does not flow through the switching diode 29 and no rectification operation occurs even if the television signal of a strong level were input. Therefore, because the received television signal of a high level does not flow through the switching diode 29, higher harmonics resulting in a disturbance are not generated at the switching diode 29.

According to the present invention, in the case of a switching system where the switching diode 29 is zero-biased at the time of reception of the UHF channels, if the tuner to which the present invention is applied is employed in that system, no higher harmonics are generated at the switching diode 29 at the time of reception of the UHF channels and no disturbance is given to the UHF tuner section 44 in the same tuner box, as well as to other tuners equipped in a nearby set. Further, in the case of another band switching system (not shown) where the switching diode 29 is reverse-biased at the time of reception of the UHF channels to prevent generation of higher harmonics, or where two tuners are equipped side-by-side as shown in FIG. 1 and a disturbance is given to either tuner whose power is off, if the present invention is applied to the tuners being equipped in the foregoing second system, no disturbance is given to the other tuner. Thus, the present invention is practically and remarkably effective, specifically, in case VTR, TV and the like are used in combination together.

In addition, according to the present invention, the diode 56 representing the PN junction across the collector and base of the transistor 51 is inserted in series with the resistor 53 and the cathode of the diode 56 is facing the ground side, so that no difficulty results from the on/off action of the switching diode 29 reflecting the band switching operation. Moreover, in case the connection of the switching diode 29 is reversed, an NPN type transistor can be employed accordingly as the transistor 51 with the same effect.

While the preferred embodiment has been described, variations thereto will occur to those skilled in the art within the scope of the present inventive concepts which are delineated by the following claims.

What is claimed is:

1. In a band switching circuit coupled to a VHF tuner and a UHF tuner of the type having a switching diode with a PN junction which is forward biased to a conducting state to short-circuit a tuning coil for tuning said VHF tuner to a high VHF channel, reverse biased to a non-conducting state to render said tuning coil operative for tuning said VHF tuner to a low VHF channel, and zero biased in a power-off state for allowing tuning said UHF tuner to a UHF channel, said band switching circuit having first and second band switching terminals which are connected to an anode side and a cathode side of said switching diode, respectively, for applying a selected bias voltage to a selected side of said switching diode, a pair of resistors, each resistor of said pair being connected between a respective one of said terminals and ground, and means for selectively applying a DC bias voltage to said first terminal, said second terminal, and to neither terminal to obtain said conducting, non-conducting, and power-off states of band switching, respectively, the improvement wherein a transistor has one terminal connected to said first band switching terminal and another terminal connected to said anode side of said switching diode such that one PN junction of said transistor is in the opposite bias direction from the PN junction of said switching diode, wherein said band switching circuit does not form a closed loop when said switching diode is zero-biased in the power-off state, whereby interference by harmonics generated by a leakage signal flowing through said switching diode in the power-off state is prevented.

2. A band switching circuit as set forth in claim 1, wherein said transistor is a PNP type transistor.

* * * * *